(12) United States Patent
Lin

(10) Patent No.: US 9,287,859 B2
(45) Date of Patent: Mar. 15, 2016

(54) FLEXIBLE INPUT/OUTPUT TRANSCEIVER

(71) Applicant: Micron Technology, Inc., Boise, ID (US)

(72) Inventor: Feng Lin, Boise, ID (US)

(73) Assignee: Micron Technology, Inc., Boise, ID (US)

(*) Notice: Subject to any disclaimer, the term of this patent is extended or adjusted under 35 U.S.C. 154(b) by 153 days.

(21) Appl. No.: 13/866,712

(22) Filed: Apr. 19, 2013

(65) Prior Publication Data
US 2014/0313844 A1 Oct. 23, 2014

(51) Int. Cl.
| G11C 8/00 | (2006.01) |
| H03K 5/003 | (2006.01) |
| G11C 7/10 | (2006.01) |

(52) U.S. Cl.
CPC ............ *H03K 5/003* (2013.01); *G11C 7/1057* (2013.01); *G11C 7/1069* (2013.01); *G11C 2207/107* (2013.01)

(58) Field of Classification Search
None
See application file for complete search history.

(56) References Cited

U.S. PATENT DOCUMENTS

| 6,255,867 B1 | 7/2001 | Chen |
| 2007/0001716 A1 | 1/2007 | Sanchez et al. |
| 2010/0176848 A1 | 7/2010 | Du et al. |
| 2011/0254160 A1 | 10/2011 | Tsai et al. |
| 2011/0309475 A1* | 12/2011 | Lee ........................ 257/532 |
| 2013/0070507 A1 | 3/2013 | Yoon |
| 2014/0176208 A1* | 6/2014 | Yamaguchi ............... 327/158 |

FOREIGN PATENT DOCUMENTS

WO WO-2014172301 A1 10/2014

OTHER PUBLICATIONS

"International Application Serial No. PCT/US2014/034069, International Search Report mailed Aug. 18, 2014", 4 pgs.
"International Application Serial No. PCT/US2014/034069, Written Opinion mailed Aug. 18, 2014", 8 pgs.

* cited by examiner

*Primary Examiner* — Kretelia Graham
(74) *Attorney, Agent, or Firm* — Schwegman Lundberg & Woessner, P.A.

(57) ABSTRACT

An I/O transceiver includes a driver with a feedback circuit having a mode select signal input, a serial data signal input, and a driver output signal input. The feedback circuit can provide a feedback control signal that is coupled to a pre-driver circuit. The pre-driver circuit can modify a data signal in response to the feedback control signal and the data signal. A driver circuit is coupled to the pre-driver circuit and can provide a driver output signal responsive to the modified data signal. A receiver can be coupled to the driver to receive the driver output signal. The receiver includes a level shifting circuit that shifts the received signal to a voltage level determined by a selected signaling interface.

29 Claims, 5 Drawing Sheets

FLEXIBLE INPUT/OUTPUT TRANSCEIVER

TECHNICAL FIELD

The present embodiments relate generally to a transceiver and a particular embodiment relates to making a flexible input/output transceiver in a memory device.

BACKGROUND

The memory industry is under constant pressure to both reduce component size as well as power requirements. One way that is being used to reduce component size is to fabricate memory devices as a three-dimensional (3D) memory device. This type of memory device can be achieved by forming a stack of memory cells vertically on a substrate, stacking a plurality of interconnected memory dies vertically within a single integrated circuit package, or some combination of these methods.

Multiple stacked memory dies in a memory package can be coupled (e.g., electrically connected) using vertical connectors, such as through silicon vias or other 3D conductive structures. Vias extend (at least partially) through a thickness of one or more of the dies and can be aligned when the dies are stacked, thus providing electrical communication among the dies in the stack. Such vias's are often formed of a conductive material, such as aluminum or copper.

In a stacked-die memory device, it is typically more efficient to combine controlling circuitry for each of the stacked memory dies of the memory package in a dedicated logic die. Thus, valuable real estate on each memory die that would normally be taken up by such controlling circuitry can be used for, for example, additional I/O instead.

One problem with having a memory device with a dedicated logic die is that the memory die of the stack conventionally utilize a fixed signaling interface. Accordingly, memory die made for use in a memory device utilizing a particular signaling interface can conventionally not be used in memory devices that utilize a different signaling interface.

DETAILED DESCRIPTION

Figure 1:
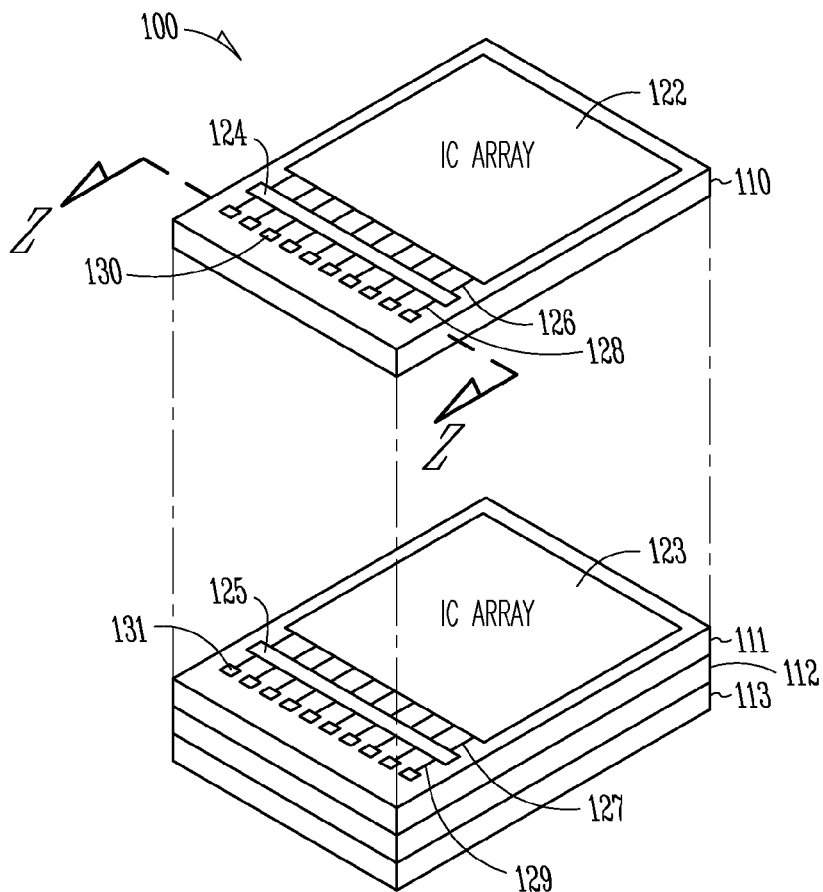
FIG. 1 shows an isometric diagram of one embodiment of a three dimensional memory device having a stack of memory dies.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Figure 2:
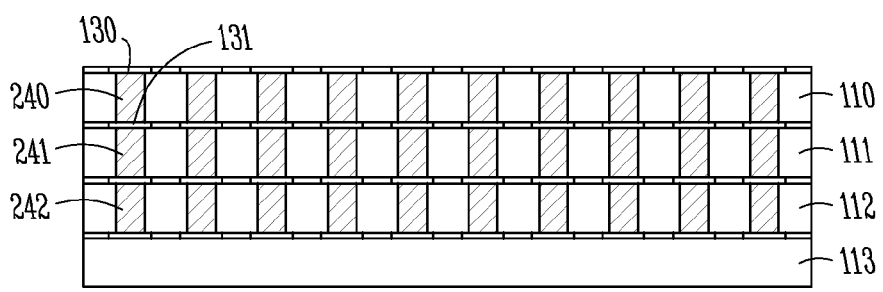
FIG. 2 shows a cross sectional view of one embodiment of a three-dimensional memory device in accordance with the embodiment of FIG. 1.

Referring to FIGS. 1 and 2, an example of a 3D memory device is illustrated. FIG. 2 is a cross-section view along axis Z-Z of FIG. 1. The 3D device 100 includes four dies 110-113 stacked over one another. Although a four die configuration is shown in FIG. 1, other configurations may include different quantities of stacked dies. The first die 110 can be the uppermost die while the fourth die 113 can be the lowermost die. The second and third dies 111, 112 can be interposed between the first and fourth dies 110, 113.

One or more of the first to third dies 110-113 can include an array 122, 123, a flexible I/O transceiver circuit 124, 125, first interconnect lines 126, 127, second interconnect lines 128, 129, and I/O nodes, such as DQ pads 130, 131. The circuits on each of the dies 110-113 can be coupled (e.g., electrically connected) through vertical connectors 240-242 (FIG. 2). The I/O transceiver circuit 124, 125 is flexible in that it can be used with different signaling interfaces as discussed subsequently.

In a silicon semiconductor device, one example of a vertical connector can be a via. One of ordinary skill in the art, having the benefit of the present disclosure, will recognize that via applies to other vertical connectors that pass at least partially through dies of different materials. In one embodiment, as illustrated in FIG. 1, the lowermost die 113 does not include a vertical connector. In one embodiment, the lowermost die can include a logic die without vertical connectors. In other embodiments, the lowermost die may include one or more vertical connectors.

The array 122, 123 can include one or more integrated circuits, including, but not limited to, one or more memory cells (for example, volatile and/or non-volatile memory cells) and one or more controllers. In one embodiment, one or more of the dies 110-113 is a memory die. Examples of memory dies can include dynamic random access memory (DRAM) dies, static random access memory (SRAM) dies, flash memory dies, resistive random access memory (RRAM) dies, as well as other types of memory. 3D memory devices using DRAM die are advantageous in complex processing operations due to their relative high access and programming speed.

In one example, one or more of the dies 110-113 includes a logic die. One example of a logic die includes controlling circuitry, addressing circuitry, and/or other memory management circuitry. In one embodiment, the logic die may not include a memory array. Thus, one embodiment of a 3D memory device 100 could include a number of stacked memory dies 110-112 and a dedicated logic die 113 stacked with the memory dies. In an alternate embodiment, the logic die 113 might comprise, for example, an application specific integrated circuit (ASIC) laterally separated from (but still coupled with) the stack of memory dies, such as where the ASIC and the stack of memory dies are mounted on a common substrate.

The first interconnect lines 126, 127 can provide data paths between the array 122, 123 and the I/O transceiver circuit 124, 125 on a respective one of the dies 110-113. The second interconnect lines 128, 129 can provide data paths between the I/O transceiver circuit 124, 125 and the I/O nodes 130, 131 of a respective one of the dies 110-113.

The vertical connectors 240-242 can provide communication paths between the I/O nodes 130, 131 of the stacked dies 110-113, thereby completing parts of data paths between the arrays 122, 123 on any two dies. In certain cases, the vertical connectors 240-242 of two or more dies 110-113 that are stacked over one another are aligned in series, and can together provide serial data paths shared among the two or more dies.

In the memory device illustrated in FIG. 1, the memory dies 110-112 can communicate with the logic die 113 through the I/O nodes 130, 131 and vertical connectors 240-242. The memory arrays 122, 123 are coupled to their respective I/O nodes 130, 131 through their respective transceiver circuits 124, 125. Since a plurality of stacked memory dies 110-112 each share the same vertical connectors 240-242, in order to avoid a data conflict, only one transceiver circuit 124, 125 should communicate over a particular vertical connector at one particular time. Thus, the other transceiver circuits can be placed in an idle state while another transceiver circuit is transmitting/receiving over a particular vertical connector. The selection of which transceiver circuit can be accomplished by an addressing signal from the logic die or some other control circuit.

In one embodiment, a transceiver circuit of a particular memory die is selected to communicate over all of the vertical connectors to the logic die at substantially one time. In another embodiment, individual drivers in each transceiver circuit can be enabled/disabled such that one memory die can access a set of one or more vertical connectors while another memory die can access a set of one or more different vertical connectors at substantially the same time.

In one embodiment, each transceiver circuit 124, 125 is made up of a plurality of I/O transceivers. For example, each I/O node 130, 131 can have a different associated I/O transceiver. Each I/O transceiver includes a driver and a receiver, as discussed subsequently.

The drivers and receivers enable the memory dies to interface with different logic dies. For example, a memory die manufacturer only needs to manufacture one memory die architecture that can then be used in multiple types of memory devices that each use a different signaling interface. The drivers and receivers are able to determine which signaling interface the logic die uses in order to transmit and receive data, to one or more of the stacked memory dies, using that particular signaling interface. The signaling interfaces might include a small-swing signaling interface for a lower-power solution (e.g., proprietary hybrid-memory cube, or HMC interfaces) and a full-swing signaling interface for a higher-power solution (e.g., double data rate—DDR). In one embodiment, the small-swing signaling can include signal swing in a range of 0V-200 mV. Full-swing signaling can include signal swing in a range of 0V-1V. The present embodiments can use other signaling interfaces.

Figure 3:
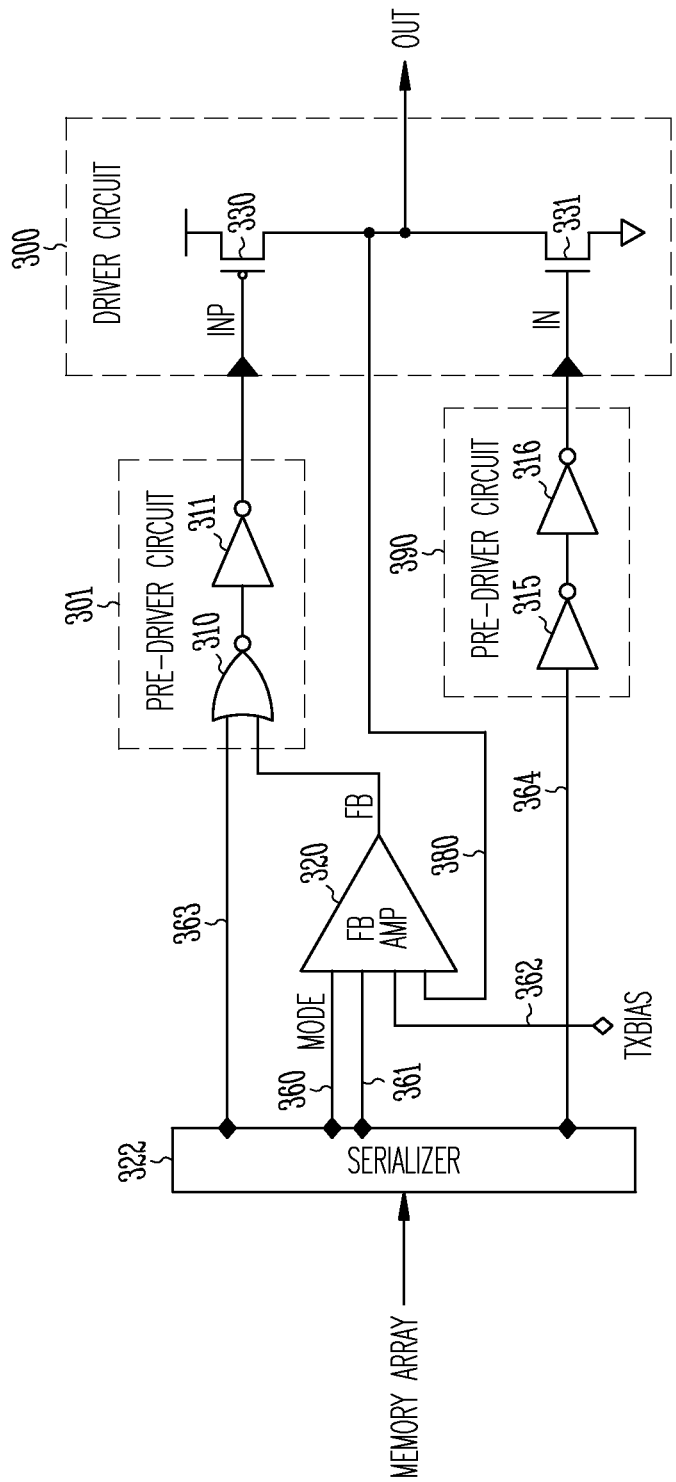
FIG. 3 shows a schematic diagram of one embodiment of a driver of an input/output transceiver.

FIG. 3 illustrates a schematic diagram of one embodiment of a driver. The driver includes a serializer 322 that is coupled to the memory array (e.g., through first interconnect lines 126, 127). The serializer 322 can convert a parallel data signal (e.g., output from the memory array) to a serial data signal for serial transmission (e.g., through a vertical or horizontal connector) to the logic die.

The serializer 322, in one embodiment, includes three serial data output signal lines 361, 363, 364 and a signaling interface mode select signal 360. The mode select signal 360 is a signal that is used to select (e.g., indicates) a signaling interface from among different signaling interface (e.g., different signaling technologies). The three serial data output signal lines 361, 363, 364 provide the same data output signal from the serializer 322 such that it can be used in different ways. For example, the data signal on the top data signal line 363 is modified by a first pre-driver circuit 301 in order to control a PMOS transistor 330 in a driver circuit 300. The data signal on the bottom data signal line 364 is buffered by a second pre-driver circuit 390 in order to control an NMOS transistor 331 in the driver circuit 300.

The signaling interface selected by the mode select signal can include CMOS, LVCMOS, full-swing signaling, and/or small-swing signaling, as well as other types of signaling interfaces. The present embodiments are not limited to any particular type of signaling interfaces.

The mode select signal 360 that is coupled from the serializer to a feedback circuit 320 (e.g., feedback amplifier) input can be set to enable the driver to implement different signaling interfaces that have different logic level switching voltages. For example, CMOS signaling uses different voltages than small-swing or LVCMOS signaling. The mode select signal 360 can be set to limit the output voltage of the driver to implement the selected signaling interface. This enables the memory die to be used with different logic dies, each having a different signaling interface (e.g., full-swing, small-swing).

The mode select signal 360 can be set during the time of manufacture of the memory die or can be programmed later. In one embodiment, the mode select signal 360 can be set by the logic die. The serializer 322 might have a register for storing one or more bits to switch between two or more logic levels. In one embodiment, the mode select signal 360 can be included in a plurality of control lines.

Another serial data output signal line 361 is coupled to an input of the feedback circuit 320. This data signal line 361 can be used by the feedback circuit 320, in combination with the other feedback circuit signal inputs, as described subsequently.

A TXBIAS signal 362 is input to the feedback circuit 320 to provide a bias voltage for the transmission of the data signal. This voltage can be a fixed voltage, as discussed subsequently with reference to FIG. 5, that provides a maximum voltage to be generated by the driver circuit 300.

An output signal 380 of the driver is fed back from the output of the driver circuit 300 to an input of the feedback circuit 320. This signal, as described subsequently, can be used to cause the feedback circuit 320 to shut off the output of the driver when the output reaches a certain voltage level.

The output of the feedback circuit 320 is a feedback control signal to an input of a logic gate 310 (e.g., NOR) of a first pre-driver circuit 301. The type of logic gate 310 used (e.g., NOR, OR) can be determined by the desired polarity of the pre-driver output signal inP. An inverter gate 311, coupled to the output of the logic gate 310, can be used to invert the output of the logic gate 310 to generate a control signal "inP" for controlling the PMOS transistor 330 of the driver circuit 300. The output of the pre-driver circuit 301 is coupled to the driver circuit 300.

The driver circuit 300 includes two transistors 330, 331 that can be used to drive the serial data signal out to the I/O nodes 130 and 131 in FIG. 1. These transistors 330, 331 are controlled by the serial data signal from the serializer 322. In the illustrated embodiment, the top transistor 330 is PMOS that has its source coupled to a first supply voltage (e.g., $V_{CC}$) node and it gate coupled to, and controlled by, the output signal inP of the first pre-driver circuit 301. The drain of the PMOS transistor 330 is coupled an output node with a drain of an NMOS transistor 331. The output node is the output of the driver circuit 300.

The gate of the NMOS transistor 331 is coupled to a second pre-driver circuit 390. In one embodiment, the second pre-driver circuit 390 comprises a pair of logic gates (e.g., inverters) 315, 316 that are coupled to the serial data output signal line 364 of the serializer 322. The pair of logic gates 315, 316 can be used to control the output slew rate and match the delay of the first pre-driver circuit 301 such that both serial data signals from serial data output signal lines 363, 364 are input to the driver circuit 300 substantially simultaneously. The source of the NMOS transistor 331 is coupled to a second supply voltage (e.g., ground) node.

The transistors 330, 331 shown as the driver circuit 300 are for purposes of illustration. Alternate embodiments can use multiple copies of the driver circuit 300 or other types of transistors for this circuit.

Figure 4:
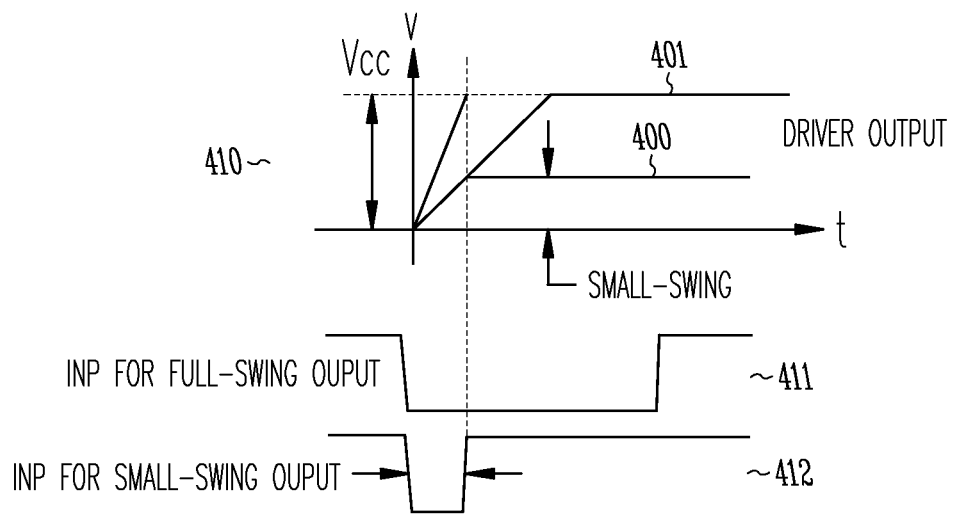
FIG. 4 shows one embodiment of a timing chart in accordance with the driver of FIG. 3.

The timing diagram of FIG. 4 illustrates part of the operation of the driver of FIG. 3. The top plot 410 shows two possible driver output signals 400, 401 as a graph of voltage versus time. The bottom driver output signal 400 is a small-swing output illustrating a lower power operation. The upper driver output signal 401 is a full-swing output illustrating a higher power operation (e.g., CMOS signaling).

The two bottom plots 411, 412 show the inP signal from FIG. 3 that is the pre-driver output signal for controlling operation of the PMOS transistor 330. The first inP signal 411 represents the higher power, full-swing output (e.g., CMOS signaling) while the second inP signal 412 represents the lower power, small-swing output.

The subsequent discussion of the small-swing output signal operation assumes that the mode select signal 360 is set to select a small-swing signaling interface. Referring to both the small-swing output signal 400 and the inP for small-swing output 412, it can be seen that the inP signal is at a logic low, thus enabling the top transistor 330 of the driver circuit 300. The driver circuit 300 is then turned on to pull the output signal towards VCC. When the ramping driver output signal reaches a certain voltage (e.g., 200 mV for small-swing signaling), the output signal 380 that is fed back to the feedback circuit 320 causes the inP signal 412 to return to a logic high state, turning off the top transistor 330 and, thus, turning off the driver output. The small swing output signal 400 is shown leveling off at the small-swing voltage at substantially the same time as the inP signal returning to the logically high state limits the output of the driver circuit 300.

The subsequent discussion of the full-swing output signal operation assumes that the mode select signal 360 is set to select a full-swing signaling interface. Referring to both the full-swing output signal 401 of driver circuit 300 and the inP for full-swing output 411 that is an input to driver circuit 300, it can be seen that the inP signal is at a logic low, thus enabling the top transistor 330 of the driver circuit 300. The driver circuit 300 is then turned on to pull the output signal towards VCC. Since the mode is set for full-swing signaling, the output voltage continues to ramp up to the full-swing voltage (e.g., VCC) since the inP for the full-swing output 411 does not return to the high state until the data bit returns to the logical high state.

Figure 5:
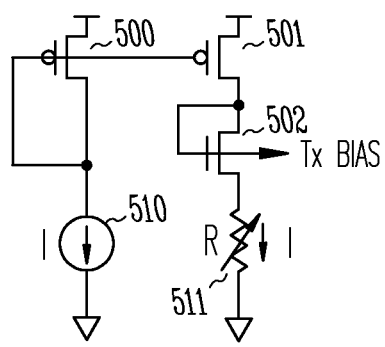
FIG. 5 shows a schematic diagram of one embodiment of a transmit bias generator in accordance with the embodiment of FIG. 4.

FIG. 5 illustrates a schematic diagram of one embodiment of a transmit bias signal (TXBIAS) generator. This circuit is shown for purposes of illustration only. Other transmit bias generator circuits that perform a similar function of generating a desired transmit voltage TXBIAS can also be used.

The transmit bias generator uses a first PMOS transistor 500, coupled in a voltage follower configuration, in series with a current source 510 (e.g., current generator circuit) to generate the current I. The first PMOS transistor is coupled to the gate of a second PMOS transistor 501 that is coupled in series with an NMOS transistor 502 and a resistor 511 of R. The NMOS transistor 502 can be used to output the TXBIAS signal to the feedback circuit 320 of FIG. 3. The TXBIAS signal is substantially equal to $I*R+V_{th}$ where $V_{th}$ is the threshold voltage of the output transistor 502. Controlled by the feedback circuit 320 of FIG. 3, the driver output signal is substantially equal to $I*R$.

Figure 6:
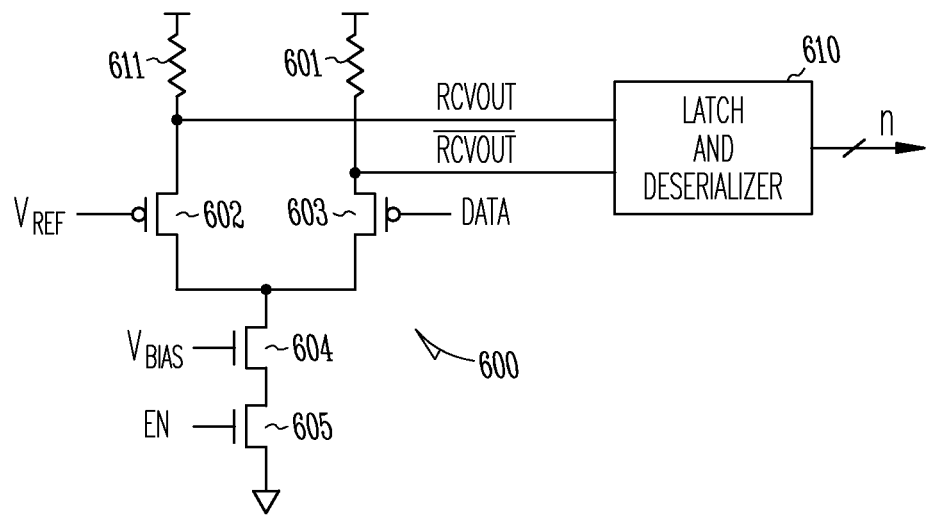
FIG. 6 shows a schematic diagram of one embodiment of a receiver of the input/output transceiver.

In operation, the value of the resistance R 511 can be adjusted to vary the output swing of the driver of FIG. 3. This adjustment can be accomplished during manufacture of the circuit, for example. By changing R, the voltage swing of the output is changed. FIG. 6 illustrates a schematic diagram of one embodiment of a receiver of an I/O transceiver. A receiver typically uses a reference voltage ($V_{ref}$) to determine a logic level of received single-ended data. However, the receiver can receive logic levels from different signaling interfaces (e.g., full-swing and small-swing), depending on which signaling interface is selected die, that can have different I/O voltages and, thus, use different $V_{ref}$ levels. The receiver of FIG. 6 uses a level shifter 600 to accommodate the multiple swing and $V_{ref}$ levels. The $V_{ref}$ voltage is supplied by a circuit not shown in FIG. 6.

One side of the level shifter 600 comprises a first resistance 611 in series with a first transistor 602 (e.g., PMOS). The first resistance 611 is pulled up to a first supply voltage (e.g., $V_{CC}$) node and coupled to the source of the first transistor 602. A gate of the first transistor 602 is coupled to a reference voltage $V_{ref}$ signal. A second side of the level shifter 600 comprises a second resistance 601 in series with a second transistor 603 (e.g., PMOS). The second resistance 601 is pulled up to the first supply voltage (e.g., $V_{CC}$) node and coupled to the source of the second transistor 603. A gate of the second transistor 603 is coupled to a data input signal. The data input signal can be the transmitted data output signal that is received from a driver similar to that illustrated in FIG. 3.

Two transistors 604, 605 (NMOS) can be coupled in series between the drains of the first and second transistors 602, 603 and a second supply voltage (e.g., ground) node. A gate of one of the series coupled transistors 604 is coupled to a $V_{BIAS}$ signal. In one embodiment, the $V_{BIAS}$ signal is provided by the same circuit that generates the TXBIAS voltage so that $V_{BIAS}$=TXBIAS. An alternate embodiment can use another bias voltage signal. A gate of the other series coupled transistor 605 is coupled to an enable signal EN. In one embodiment, the two series coupled transistors 604, 605 act as an enable circuit for the level shifter 600 since a logical high EN signal in combination with an active $V_{BIAS}$ voltage signal would turn on the level shifter 600.

In operation, the $V_{ref}$ voltage signal that is applied to the first transistor 602 is generated responsive to the signaling interface selected by the mode select signal of FIG. 3. The $V_{ref}$ voltage signal can be generate by a typical voltage generation circuit that selects an output voltage signal based on the mode select signal. Thus, if the signaling interface is selected to be a full-swing signaling interface, the $V_{ref}$ signal might be higher than if the signaling interface is selected to be a small-swing signaling interface. For example, $V_{ref}$ might be greater than 500 mV for a full-swing signaling interface while $V_{ref}$ might be less than 200 mV for a small-swing signaling interface. The DATA signal that is applied to the second transistor 603 can be the received data signal from a driver such as that illustrated in FIG. 3 (e.g., through a vertical connector) that is to be level shifted. The level shifter differential output signals RCVOUT and RCVOUTb are thus the received data signal that has been voltage level shifted according to the selected signaling interface.

The level shifted differential output signals RCVOUT and RCVOUTb are input to a latch and deserializer 610. The latch provides temporary storage while the deserializer takes the received serial data signal and converts it to a parallel "n" bit word format for use by other circuits (e.g., logic die circuitry).

Figure 7:
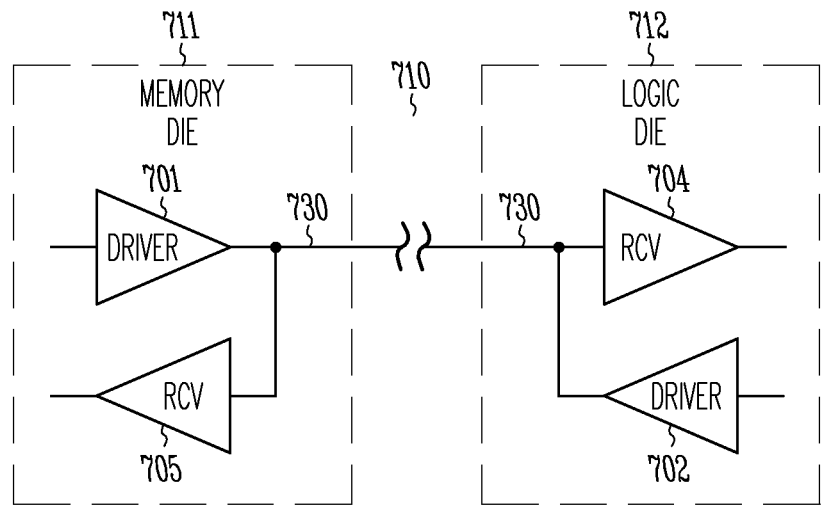
FIG. 7 shows a block diagram of one embodiment of a memory device in accordance with the input/output transceiver of FIGS. 3 and 6.

FIG. 7 illustrates a block diagram of one embodiment of a memory device incorporating the I/O transceiver. For purposes of clarity, the memory device is shown with one memory die 711 and a logic die 712 that includes controlling circuitry for controlling the memory device. The memory die 711 and logic die 712 are coupled over at least one common interconnect 710, such as a vertical connector (e.g., TSV) 730.

The memory die 711 includes at least one driver 701 as shown in FIG. 3 and at least one receiver 705 as shown in FIG. 6. The driver 701 and receiver 705 make up the I/O transceiver for communicating with the logic die (e.g., over a vertical connector 730 or a horizontal connector (not shown)).

The logic die 712 includes at least one driver 702 as shown in FIG. 3 and at least one receiver 704 as shown in FIG. 6. The driver 702 and receiver 704 make up another I/O transceiver for communicating with memory dies (e.g., over the vertical connector 730). The interconnect 710 between the memory die 711 and the logic die 712 can include additional memory dies coupled to the same vertical connector 730. In one embodiment, the I/O transceivers of these additional memory dies would be idle while the shown memory die 711 communicates with the logic die 712.

Figure 8:
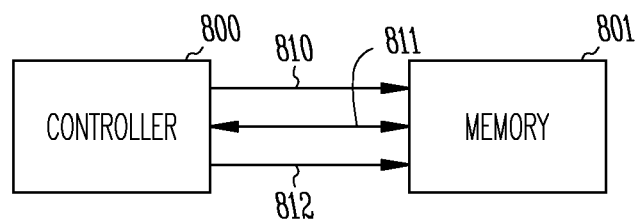
FIG. 8 shows a block diagram of one embodiment of a system in accordance with the memory device of FIG. 7.

FIG. 8 illustrates a block diagram of one embodiment of a system that can incorporate a memory device 801 as shown in FIG. 7. The memory device 801 can be coupled to a controller 800 (e.g., processor) over address 810, data 811, and control 812 buses. The memory device 801 can be fabricated as a 3D memory device that uses multiple stacked memory dies and a logic die that communicate (e.g., over vertical connectors) using the I/O transceiver.

CONCLUSION

In summary, one or more embodiments use a mode-selectable, flexible I/O transceiver for communicating between dies of a memory device. A feedback circuit can be used to shut off a driver circuit responsive to a mode select signal and a feedback of the driver output signal. A receiver can level shift a received data signal responsive to a reference voltage associated with a particular signaling interface used by the associated driver.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention.

What is claimed is:

1. A driver comprising:
   a feedback circuit configured to provide a feedback control signal responsive to a mode select signal, a data output signal, and a driver output signal;
   a pre-driver circuit configured to receive the data output signal and the feedback control signal, and to modify the data output signal responsive to the feedback control signal; and
   a driver circuit configured to provide the driver output signal responsive to the modified data output signal.

2. The driver of claim 1 wherein the feedback circuit comprises a feedback amplifier.

3. The driver of claim 1 wherein the feedback circuit is further coupled to a transmit bias voltage generator.

4. The driver of claim 1 wherein the driver circuit comprises:
   a first transistor having a gate configured to receive the modified data output signal; and
   a second transistor having a gate configured to receive a buffered version of the data output signal;
   wherein the first and second transistors are coupled together at an output node such that the driver output signal is provided at the output node.

5. The driver of claim 1 wherein the pre-driver circuit comprises a logic gate having a first input coupled to the feedback circuit to receive the feedback control signal and a second input configured to receive the data output signal.

6. The driver of claim 1 and further comprising a serializer configured to provide the data output signal.

7. The driver of claim 6 wherein the serializer is configured to provide the data output signal by converting a parallel data signal to a serial data signal.

8. The driver of claim 1, wherein the pre-driver circuit comprises a first pre-driver circuit and further comprising a second pre-driver circuit configured to buffer the data output signal, wherein the driver circuit being configured to provide the driver output signal responsive to the modified data output signal comprises the driver circuit being configured to provide the driver output signal responsive to the modified data output signal and the buffered data output signal.

9. The driver of claim 8, wherein the second pre-driver circuit is configured to control a slew rate of the driver output signal and match a delay of the first pre-driver circuit.

10. The driver of claim 3 wherein the transmit bias generator is configured to generate a transmit bias voltage.

11. The driver of claim 10 wherein the transmit bias generator comprises:
    a current generator circuit configured to generate a current I;
    an output transistor coupled to the current generator circuit; and
    a resistance R coupled to the output transistor wherein the transmit bias voltage comprises I*R plus a threshold voltage of the output transistor.

12. The driver of claim 8 wherein the driver circuit comprises:
    a first transistor having a gate configured to receive the modified driver control signal; and
    a second transistor having a gate configured to receive the buffered data output signal and a drain coupled to a drain of the first transistor.

13. The driver of claim 10 wherein a voltage level and a slew rate of the driver output signal is responsive to the transmit bias voltage.

14. A memory device comprising:
    a memory array;
    a plurality of vertical connectors; and
    a plurality of I/O transceivers coupled between the memory array and the plurality of vertical connectors, each transceiver of the plurality of I/O transceivers coupled to a different one of the plurality of vertical connectors;
    wherein each of the plurality of I/O transceivers comprises:
       a feedback circuit configured to provide a feedback control signal responsive to a mode select signal, a data output signal, and a driver output signal;

a pre-driver circuit configured to receive the data output signal and the feedback control signal, and to modify the data output signal responsive to the feedback control signal; and a driver circuit configured to provide the driver output signal responsive to the modified data output signal.

15. The memory device of claim 14 wherein the memory array, the plurality of vertical connectors, and the plurality of I/O transceivers are part of a memory die and the memory device further comprises a logic die coupled to the memory die.

16. The memory device of claim 15 wherein the plurality of I/O transceivers comprises a first plurality of I/O transceivers, and the logic die comprises:

memory management circuitry configured to control the memory array; and a second plurality of I/O transceivers coupled between the memory management circuitry and the plurality of vertical connectors, each I/O transceiver of the second plurality of I/O transceivers coupled to a different one of the plurality of vertical connectors.

17. The memory device of claim 16 wherein the memory management circuitry comprises controlling circuitry and addressing circuitry.

18. The memory device of claim 15 wherein the memory die comprises a particular memory die of a plurality of memory dies coupled to the logic die.

19. The memory device of claim 18 wherein the plurality of memory dies are stacked together.

20. The memory device of claim 19, wherein the logic die is stacked with the plurality of memory dies.

21. The memory device of claim 19, wherein the logic die is laterally separated from the plurality of memory dies.

22. A system comprising:
a controller; and
a memory device coupled to the controller, the memory device comprising:
a plurality of stacked memory dies coupled over a plurality of vertical connectors; and
a logic die coupled with the plurality of stacked memory dies;
wherein each memory die of the plurality of stacked memory dies comprises a respective plurality of I/O transceivers coupled to the plurality of vertical connectors, each I/O transceiver of the plurality of I/O transceivers comprising:
a feedback circuit configured to provide a feedback control signal responsive to a mode select signal, a data output signal, and a driver output signal;
a pre-driver circuit configured to receive the data output signal and the feedback control signal, and to modify the data output signal responsive to the feedback control signal; and
a driver circuit configured to provide the driver output signal responsive to the modified data output signal.

23. The system of claim 22 wherein each I/O transceiver of the plurality of I/O transceivers further comprises a receiver comprising:
a level shifter having a reference voltage input and a data signal input, the level shifter configured to provide a differential level shifted output signal; and
a latch circuit coupled to the differential level shifted output signal;
wherein the receiver is configured to implement a selected signaling interface responsive to a signal received at the reference voltage input.

24. The system of claim 22 wherein each I/O transceiver of the plurality of I/O transceivers is configured to implement a selected signaling interface responsive to the mode select signal.

25. The system of claim 24 wherein the selected signaling interface comprise one of a full-swing signaling interface and a small-swing signaling interface.

26. The system of claim 22 wherein the driver circuit comprises a PMOS transistor in series with an NMOS transistor and the driver output signal is provided at a node between the PMOS transistor and the NMOS transistor.

27. A method for communicating in a memory device, the method comprising:
receiving a mode select signal at a feedback circuit;
receiving a serial data signal at the feedback circuit;
providing a feedback control signal from the feedback circuit to a pre-driver circuit responsive to an output signal of a driver circuit, the serial data signal, and the mode select signal;
providing a modified serial data signal from the pre-driver to the driver circuit responsive to the serial data signal and the feedback control signal; and
providing the output signal from the driver circuit responsive to the modified serial data signal.

28. A memory device comprising:
a stack of memory dies, wherein each of the memory dies of the stack of memory dies comprises a respective memory array; and
a logic die coupled with the stack of memory dies,
wherein each of the memory dies of the stack of memory dies comprises a respective plurality of I/O transceivers, coupled between the respective memory array and a plurality of vertical connectors, and configured to selectively implement one of a plurality of signaling interfaces.

29. The memory device of claim 28, wherein the plurality of I/O transceivers are configured to determine which one of the plurality of signaling interfaces to implement responsive to determining which signaling interface the logic die uses.

* * * * *